US012811206B2

(12) United States Patent
Baik et al.

(10) Patent No.: US 12,811,206 B2
(45) Date of Patent: Nov. 24, 2026

(54) SYSTEM AND METHOD OF DIAGNOSING BATTERY CELLS USING ASYNCHRONOUS WIRELESS COMMUNICATION

(71) Applicants: AIRPOINT CO., LTD.; Cell Point Co., LTD., Daejeon (KR)

(72) Inventors: Sung Jun Baik, Daejeon (KR); Jun Ho Cho, Daejeon (KR)

(73) Assignees: AIRPOINT Co., Ltd., Daejeon (KR); Cell Point Co., Ltd., Daejeon (KR)

( * ) Notice: Subject to any disclaimer, the term of this patent is extended or adjusted under 35 U.S.C. 154(b) by 772 days.

(21) Appl. No.: 18/332,732

(22) Filed: Jun. 10, 2023

(65) Prior Publication Data

US 2024/0332643 A1 Oct. 3, 2024

(30) Foreign Application Priority Data

Mar. 27, 2023 (KR) ........................ 10-2023-0039543

(51) Int. Cl.
*H01M 10/42* (2006.01)
*G01R 31/371* (2019.01)
(Continued)

(52) U.S. Cl.
CPC ........ *H01M 10/425* (2013.01); *G01R 31/371* (2019.01); *G08C 15/06* (2013.01); (Continued)

(58) Field of Classification Search
CPC ............. H01M 10/425; H01M 10/482; H01M 2010/4271; H01M 2010/4278;
(Continued)

(56) References Cited

U.S. PATENT DOCUMENTS 12,412,465 B1 * 9/2025 Daoura .................. H04W 4/80
2015/0340888 A1 11/2015 Hofer
(Continued)

FOREIGN PATENT DOCUMENTS

KR 10-2018-0132896 12/2018
KR 10-2019-0092088 8/2019
(Continued)

OTHER PUBLICATIONS

Samanta et al., "A Survey of Wireless Battery Management System: Topology, Emerging Trends, and Challenges" Electronics 2021, 10, 2193 (Year: 2021).*

(Continued)

*Primary Examiner* — John C Kuan

(57) ABSTRACT

The present invention relates to a system and a method of diagnosing battery cells using asynchronous wireless communication, the system including a master BMS and a plurality of direct BMSs, in which a battery cell connection unit included in each direct BMS comes into direct contact with a positive terminal and a negative terminal of each of a plurality of battery cells included in a battery module, so as to measure raw data of a voltage of each battery cell and raw data of a current of the battery module, each of the direct BMSs transmits information of the battery module in contact with the direct BMS to a master BMS in an asynchronous wireless communication manner, wherein the size of complexity of the wireless communication unit provided inside the direct BMS is reduced, so that a compact and simple structure is implemented.

8 Claims, 11 Drawing Sheets

(51) Int. Cl.

| | |
|---|---|
| ***G01R 31/3842*** | (2019.01) |
| ***G01R 31/396*** | (2019.01) |
| ***G08C 15/06*** | (2006.01) |
| ***H01M 10/48*** | (2006.01) |
| ***H04L 27/18*** | (2006.01) |
| ***H04L 67/12*** | (2022.01) |

(52) U.S. Cl.
CPC .......... *H01M 10/482* (2013.01); *H04L 67/12* (2013.01); *G01R 31/3842* (2019.01); *G01R 31/396* (2019.01); *H01M 2010/4271* (2013.01); *H01M 2010/4278* (2013.01); *H01M 2220/20* (2013.01); *H04L 27/18* (2013.01)

(58) Field of Classification Search
CPC ............. H01M 2220/20; G01R 31/371; G01R 31/3842; G01R 31/396; G08C 15/06; H04L 67/12; H04L 27/18
See application file for complete search history.

(56) References Cited

U.S. PATENT DOCUMENTS

| | | | | |
|---|---|---|---|---|
| 2016/0301112 | A1* | 10/2016 | Yamazoe ............ | H01M 10/482 |
| 2017/0351561 | A1* | 12/2017 | Yamazoe ............ | G06F 11/0745 |
| 2020/0091608 | A1* | 3/2020 | Alpman ............... | H01Q 9/0414 |
| 2021/0281988 | A1* | 9/2021 | Han ........................ | B60L 58/18 |
| 2022/0200642 | A1* | 6/2022 | Agrawal .............. | H04B 1/0458 |

FOREIGN PATENT DOCUMENTS

| | | |
|---|---|---|
| KR | 10-2022-0129735 | 9/2022 |
| KR | 10-2023-0004400 | 1/2023 |

OTHER PUBLICATIONS

Suresh et al., "Implementation of Digital Modulation Scheme using LabVIEW" IEEE International Conference on Power, Control, Signals and Instrumentation Engineering (ICPCSI-2017) (Year: 2017).*

Office Action for Korea Patent Application No. 10-2023-0039543, mailed Nov. 22, 2024.

Notice of Allowance for Korea Patent Application No. 10-2023-0039543, mailed Feb. 11, 2025.

* cited by examiner

SYSTEM AND METHOD OF DIAGNOSING BATTERY CELLS USING ASYNCHRONOUS WIRELESS COMMUNICATION

BACKGROUND OF THE INVENTION

1. Field of the Invention

The present invention relates to a system and a method of diagnosing battery cells using asynchronous wireless communication, and more particularly, to a system and a method of diagnosing battery cells using asynchronous wireless communication, the system including a master BMS and a plurality of direct BMSs, in which a battery cell connection unit included in each direct BMS comes into direct contact with a positive terminal and a negative terminal of each of a plurality of battery cells included in a battery module, so as to measure raw data of a voltage of each battery cell and raw data of a current of the battery module, each of the direct BMSs transmits information of the battery module in contact with the direct BMS to a master BMS in an asynchronous wireless communication manner, and the direct BMS includes a communication modem capable of modulating a digital signal into a differential phase shift modulation signal or demodulating a differential phase shift modulation signal into a digital signal, wherein the size of complexity of the wireless communication unit provided inside the direct BMS is reduced, so that a compact and simple structure is implemented.

2. Description of the Related Art

Recently, environmental regulations for vehicles having internal combustion engines have been gradually severe all over the world, and accordingly, demands for vehicles, such as electric vehicles (EVs) or hybrid vehicles (MHEVs, PHEVs and FHEVs), using battery power as motive power have increased. As a result, automotive companies around the world have been increasingly interested in battery management technologies for improving efficiency, performance and durability of batteries, and researches and developments related to the technologies are being actively conducted in various companies and research organizations.

Particularly, a voltage, a current, and a temperature are the most important indicators among various indicators capable of determining a condition of a battery installed in a vehicle. A battery management system (BMS) for managing and controlling the battery can determine the state of the battery by measuring the voltage, current, temperature and the like of the battery installed in the vehicle. In general, the BMS includes: a plurality of slave BMS for managing at least one battery module; and a master BMS for controlling the slave BMSs.

In addition, the conventional BMS has a configuration separate from a battery in consideration of process efficiency, adopts a scheme of wired connection between the battery and the BMS in a conservative manner using a plurality of electric cables in consideration of specificity of the vehicle. When multiple slave BMSs and master BMSs perform wired communication with each other through the above wired connection scheme, a process of switching channels for muxing of data is required, and noise is generated during the process. In addition, in the conventional art using the wired communication an isolator for separating signal components is required to be applied to or installed in a plurality of locations in order to prevent electro-magnetic interference from being induced through wired cables and the like.

In addition, as disclosed in Korean Unexamined Patent No. 10-2023-0004400, there are technologies for allowing a master BMS and a plurality of slave BMS to communicate wirelessly to manage batteries. However, the wired connection scheme using an electric cable and the like is still adopted between the battery and the BMS, and there is nothing disclosed or suggested about a wireless communication system in consideration of the specificity of the vehicle. Thus, a novel type of BMS technology for improving the problems of the above-mentioned conventional BMS technology is required.

(Patent Document 1) Korean Unexamined Patent No. 10-2023-0004400 (Jan. 6, 2023)

SUMMARY OF THE INVENTION

The present invention relates to a system and a method of diagnosing battery cells using asynchronous wireless communication, and more particularly, an object of the present invention is to provide a system and a method of diagnosing battery cells using asynchronous wireless communication, the system including a master BMS and a plurality of direct BMSs, in which a battery cell connection unit included in each direct BMS comes into direct contact with a positive terminal and a negative terminal of each of a plurality of battery cells included in a battery module, so as to measure raw data of a voltage of each battery cell and raw data of a current of the battery module, each of the direct BMSs transmits information of the battery module in contact with the direct BMS to a master BMS in an asynchronous wireless communication manner, and the direct BMS includes a communication modem capable of modulating a digital signal into a differential phase shift modulation signal or demodulating a differential phase shift modulation signal into a digital signal, wherein the size of complexity of the wireless communication unit provided inside the direct BMS is reduced, so that a compact and simple structure is implemented.

In order to solve the above problems, one embodiment of the present invention provides a system of diagnosing battery cells positioned inside a vehicle, which includes: a plurality of direct BMSs disposed inside the vehicle and electrically connected to a plurality of battery cells included in a battery module; and a master BMS disposed inside the vehicle to perform wireless communication with the direct BMSs, wherein the direct BMS includes: a battery cell connection unit having ports coming into physically and electrically direct contact with exposed electrodes of the battery cells, respectively; a voltage measurement unit electrically connected to the battery cell connection unit and having a circuit form to measure a voltage of each battery cell; a current measurement unit electrically connected to the battery cell connection unit and having a circuit form to measure a current of the battery cell or the battery module; an MCU; and a first wireless communication unit connected to the MCU to perform wireless communication with the master BMS, wherein the first wireless communication unit, upon transmitting data, modulates binarized data received from the MCU into a phase shift modulation signal and modulates the phase shift modulation signal into a differential phase modulation signal, thereby shift transmitting the modulated differential phase shift modulation signal to an outside, and, upon receiving data, demodulates the received differential phase shift modulation signal into a phase shift modulation signal and demodulates the demodulated phase shift modulation signal into binarized data, thereby transmitting the demodulated binarized data to the MCU.

According to one embodiment of the present invention, both of a positive terminal and a negative terminal of the battery cell may come into direct contact with a port provided in the battery cell connection unit, and the voltage measurement unit may be connected to each of the ports to measure a voltage of each battery cell.

According to one embodiment of the present invention, a communication frame of a wireless communication channel through which the direct BMSs transmit and receive data with the master BMS via the first wireless communication unit includes a sub-frame including: a downlink frame broadcasted by the master BMS to the direct BMSs; and a plurality of uplink frames transmitted by each of the direct BMSs to the master BMS, and the downlink frame and each of the uplink frames in the sub-frame may be divided temporally.

According to one embodiment of the present invention, the data received by the direct BMSs through the downlink frame includes: identifier information of each direct BMS; and time division information of an uplink frame related to the direct BMS having the corresponding identifier information, wherein each direct BMS may transmit data to the master BMS through the uplink frame assigned to the direct BMS, based on the time division information of the uplink frame included in the data received by the downlink frame.

According to one embodiment of the present invention, the wireless communication channel may be temporally configured to have a plurality of uplink frames subject to preset rules after the downlink frame, data broadcasted in the downlink frame may include request information about a target to be transmitted from each direct BMS, and each direct BMS may generate response information according to the request information included in the data broadcasted in the downlink frame, so that data including the response information may be transmitted to the master BMS according to time division information of its own uplink frame.

According to one embodiment of the present invention, the communication frame of the wireless communication channel may include a plurality of identical sub-frames, and the master BMS may finally determine received data based on a plurality of received identical uplink frames.

According to one embodiment of the present invention, a cycle of the communication frame of the wireless communication channel between the direct BMS and the master BMS or a time interval between successive communication frames may vary according to a driving condition of the vehicle in which the battery module is installed.

In order to solve the above problem, one embodiment of the present invention provides a method of diagnosing battery cells performed by a system of diagnosing the battery cells positioned inside a vehicle and including: a plurality of direct BMSs disposed inside the vehicle and electrically connected to a plurality of battery cells included in a battery module; and a master BMS disposed inside the vehicle to perform wireless communication with the direct BMSs, and the method of diagnosing the battery cells includes: physically and electrically bringing a port included in the battery cell connection unit into direct contact with an exposed electrode of each of the battery cells, by a battery cell connection unit of the direct BMS; measuring a voltage of each battery cell, by a voltage measurement unit of the direct BMS; measuring a current of the battery cell or the battery module, by a current measurement unit of the direct BMS; and performing wireless communication with the master BMS, by a first wireless communication unit of the direct BMS, wherein the first wireless communication unit is connected to an MCU of the direct BMS, the first wireless communication unit, upon transmitting data, modulates binarized data received from the MCU into a phase shift modulation signal and modulates the phase shift modulation signal into a differential phase shift modulation signal, thereby transmitting the modulated differential phase shift modulation signal to an outside, and, upon receiving data, demodulates the received differential phase shift modulation signal into a phase shift modulation signal and demodulates a decoded phase shift modulation signal into binarized data, thereby transmitting the demodulated binarized data to the MCU.

According to one embodiment of the present invention, the direct BMS is configured to physically and electrically come into direct contact with the battery cells, thereby measuring the voltage and the current for the battery cells, so that noise generated due to channel switching can be prevented in the related art in which the battery and the direct BMS are indirectly connected through a cable or the like, and accordingly, the reliability of data measured for the battery cells can be increased.

According to one embodiment of the present invention, the direct BMS is configured to physically and electrically come into direct contact with each of the battery cells, thereby measuring voltage information on each of the battery cells, so that the conventional problem that a predetermined number of battery cells among a plurality of battery cells have different voltages and generate noise that cannot be corrected can be solved, and accordingly, data having more reliability can be obtained.

According to one embodiment of the present invention, a master BMS and a plurality of direct BMSs connected to each of a plurality of battery modules perform asynchronous wireless communication, so that the problems caused by applying or installing an isolator to a plurality of positions to prevent electro-magnetic interference from being induced in the wired communication system of the related art, such deterioration in space efficiency, increase in weight, and increase in cost, can be solved.

According to one embodiment of the present invention, a plurality of direct BMSs and a master BMS connected to each of a plurality of battery modules include a communication modem capable of modulating a digital signal into a differential phase shift modulation signal or demodulating a differential phase shift modulation signal into a digital signal so as to perform asynchronous wireless communication, so that the communication module for performing the asynchronous wireless communication can have a simple structure but have a good frequency efficiency, and stable wireless communication can be implemented even in the special environment of a vehicle.

According to one embodiment of the present invention, the battery module and the direct BMS are physically directly connected without a separate component such as a cable, so that durability against vibration can be improved compared to the conventional vehicle battery management systems, and accordingly, reliability of measured data can be increased even in the special measurement situations such as high-speed driving environments.

DETAILED DESCRIPTION OF THE INVENTION

Figure 1:
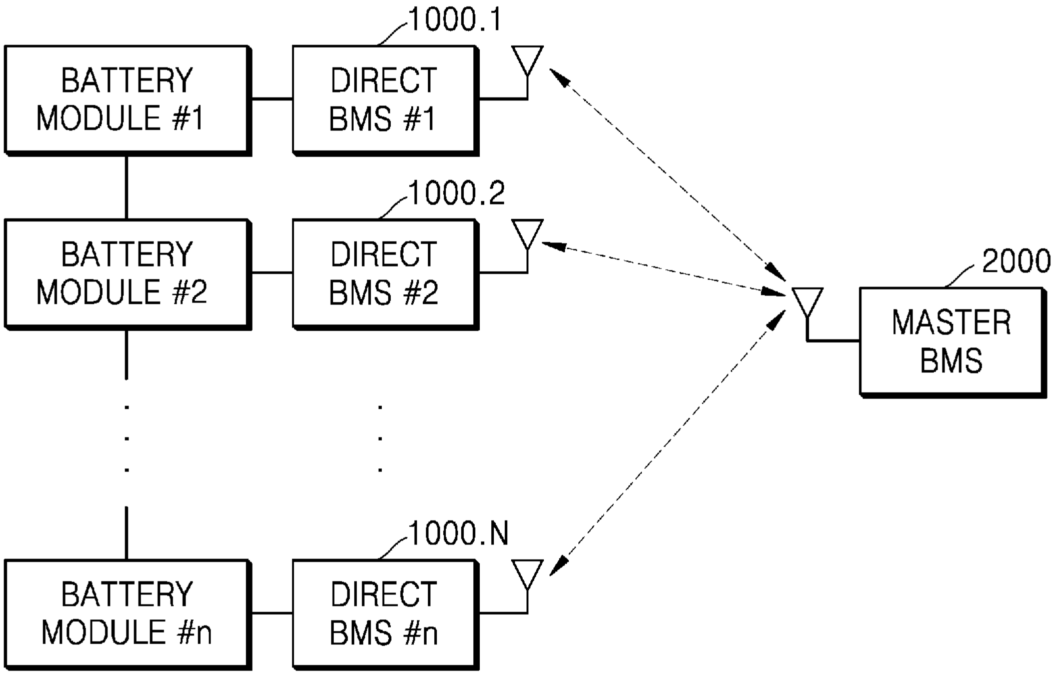
FIG. 1 schematically shows the configuration of a system of diagnosing battery cells according to one embodiment of the present invention.

Hereinafter, various embodiments and/or aspects will be described with reference to the drawings. In the following description, numerous specific details are set forth in order to provide a thorough understanding of one or more aspects for the purpose of explanation. However, it will also be appreciated by a person having ordinary skill in the art that such aspect (s) may be carried out without the specific details. The following description and accompanying drawings will be set forth in detail for specific illustrative aspects among one or more aspects. However, the aspects are merely illustrative, some of various ways among principles of the various aspects may be employed, and the descriptions set forth herein are intended to include all the various aspects and equivalents thereof.

In addition, various aspects and features will be presented by a system that may include a plurality of devices, components and/or modules or the like. It will also be understood and appreciated that various systems may include additional devices, components and/or modules or the like, and/or may not include all the devices, components, modules or the like recited with reference to the drawings.

The term "embodiment", "example", "aspect", "exemplification", or the like as used herein may not be construed in that an aspect or design set forth herein is preferable or advantageous than other aspects or designs. The terms 'unit', ' component', 'module', 'system', 'interface' or the like used in the following generally refer to a computer-related entity, and may refer to, for example, hardware, software, or a combination of hardware and software.

In addition, the terms "include" and/or "comprise" specify the presence of the corresponding feature and/or component, but do not preclude the possibility of the presence or addition of one or more other features, components or combinations thereof.

In addition, the terms including an ordinal number such as first and second may be used to describe various components, however, the components are not limited by the terms. The terms are used only for the purpose of distinguishing one component from another component. For example, the first component may be referred to as the second component without departing from the scope of the present invention, and similarly, the second component may also be referred to as the first component. The term "and/or" includes any one of a plurality of related listed items or a combination thereof.

In addition, in embodiments of the present invention, unless defined otherwise, all terms used herein including technical or scientific terms have the same meaning as commonly understood by those having ordinary skill in the art. Terms such as those defined in generally used dictionaries will be interpreted to have the meaning consistent with the meaning in the context of the related art, and will not be interpreted as an ideal or excessively formal meaning unless expressly defined in the embodiment of the present invention.

FIG. 1 schematically shows the configuration of a system of diagnosing battery cells according to one embodiment of the present invention.

Specifically, the system of diagnosing the battery cells of the present invention senses a plurality of pieces of information about a battery provided inside a vehicle using battery power as motive power, and diagnoses the battery based on the sensed information. As shown in FIG. 1, the diagnosis system includes a plurality of direct BMSs 1000 (1000.1 to 1000.N) and a master BMS 2000 and the master BMS 2000 wirelessly communicates with each of the direct BMSs 1000. In other words, in FIG. 1, solid lines illustrate physically accessed or contacted parts, and dotted lines illustrate wirelessly connected configurations.

The diagnosis system may be electrically connected to the battery positioned inside the vehicle, so that a plurality of indices for managing the battery may be measured. The indices include a voltage, a current, and a temperature. In addition, according to the known technology, the battery connected to the diagnostic system of the present invention and described later is configured to include: a battery module including a plurality of battery cells; and a battery pack including a plurality of battery modules, but the present invention is not limited thereto, and the present invention may be applied to any battery including a plurality of battery cells.

More specifically, each of the direct BMSs 1000 may be electrically connected to a plurality of battery cells to measure a voltage, a current, and a temperature of the connected battery cells. In one embodiment of the present invention as shown in FIG. 1, each of the direct BMSs 1000 is electrically connected to one battery module. In addition, in another embodiment of the present invention, a unit of the battery cells connected to each of the direct BMSs 1000 is not limited to a battery module, and the unit may be set as a battery cell group composed of a predetermined number of battery cells.

Hereinafter, the configuration will be described in which the direct BMSs 1000 are connected to the battery modules, respectively. It may be preferable that the number of the direct BMSs 1000 provided in the diagnosis system of the present invention corresponds to the number of battery modules included in the corresponding battery.

The information sensed from the battery module connected to each of the direct BMSs 1000 may be transmitted to the master BMS 2000 through a first wireless communication unit 1600 (see FIG. 2) included in each of the direct BMSs 1000. The master BMS 2000 diagnoses a condition of the corresponding battery based on the information received from each of the direct BMSs 1000. Hereinafter, the hardware configuration of the battery cell diagnosis system of the present invention and the configuration of communication between the direct BMS 1000 and the master BMS 2000 will be described in detail.

Figure 2:
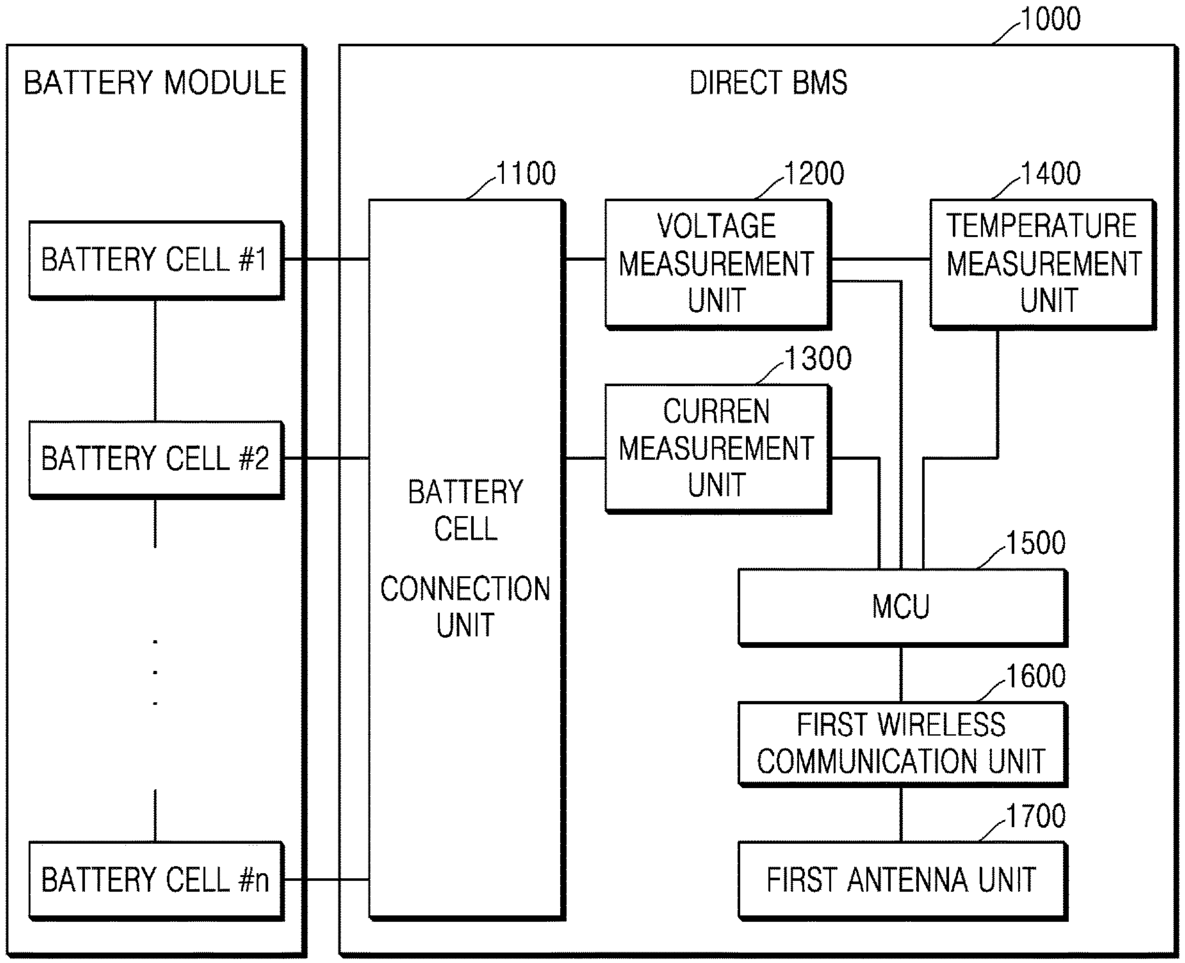
FIG. 2 schematically shows the internal configuration of a direct BMS according to one embodiment of the present invention.
Figure 3:
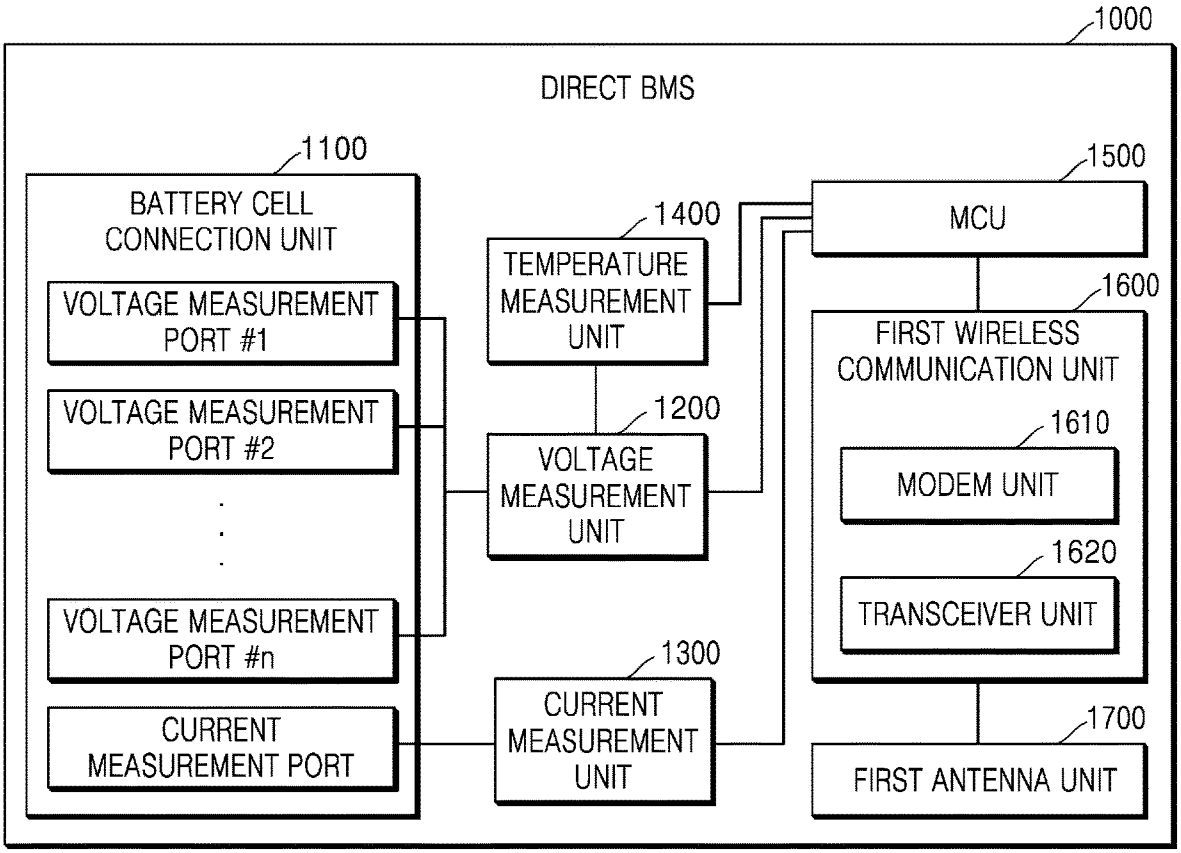
FIG. 3 schematically shows the internal configuration of a direct BMS according to another embodiment of the present invention.

FIG. 2 schematically shows the internal configuration of the direct BMS 1000 according to one embodiment of the present invention. FIG. 3 schematically shows the internal configuration of a direct BMS 1000 according to another embodiment of the present invention.

As shown in FIGS. 2 and 3, a system of diagnosing battery cells positioned inside a vehicle includes: a plurality of direct BMSs 1000 disposed inside the vehicle and electrically connected to a plurality of battery cells included in a battery module; and a master BMS disposed inside the vehicle to perform wireless communication with the direct BMSs, wherein the direct BMS 1000 includes: a battery cell connection unit 1100 having ports coming into physically and electrically direct contact with exposed electrodes of the battery cells, respectively; a voltage measurement unit 1200 electrically connected to the battery cell connection unit 1100 and having a circuit form to measure a voltage of each battery cell; a current measurement unit 1300 electrically connected to the battery cell connection unit 1100 and having a circuit form to measure a current of the battery cell or the battery module; an MCU 1500; and a first wireless communication unit 1600 connected to the MCU 1500 to perform wireless communication with the master BMS 2000.

Specifically, the battery cell connection unit 1100 includes a plurality of ports, in which electrodes of the battery cells connected to the corresponding direct BMS 1000 come into physically direct contact with the ports, respectively, without a separate component such as a cable. According to the above configuration, the problems in the related art described below can be solved.

In the conventional battery management system technology, a plurality of battery cells are grouped, and signal output lines from the grouped battery cells are connected to a single slave BMS. For example, when it is assumed that one battery module has 25 battery cells, the 25 battery cells may be grouped into 5 groups with 5 battery cells for each group, so that signals obtained by measuring a voltage and a current of all five battery cells may be transmitted to the slave BMS through separate wired communication. In addition, since the signals transmitted from the 5 signal lines cannot be simultaneously transmitted to the slave BMS, a module capable of switching channels between the 5 signal lines and the slave BMS is required.

Accordingly, the one slave BMS receives information through a total of 5 signal lines for 25 battery cells, and noise caused by the switching module is generated in the above process. In addition, in the battery management system having the above configuration, an isolator for separating signal components is required to be applied to or installed in a plurality of locations in order to prevent electro-magnetic interference from being induced between a plurality of signal lines.

In other words, in order to solve the noise due to switching or the problems that may occur due to the isolator, the present invention is configured to have the battery cell connection unit 1100 in which the ports and the electrodes of the battery cells come into physically direct contact with each other, respectively. The configuration of the battery cell connection unit 1100 will be described later in more detail in the description of FIG. 4.

The direct BMS 1000 includes a voltage measurement unit 1200, a current measurement unit 1300, and a temperature measurement unit 1400. The voltage measurement unit 1200 is configured to have a circuit form, and measures a voltage of each of a plurality of battery cells included in a battery module connected to the direct BMS 1000 through the battery cell connection unit 1100. More specifically, referring to FIG. 3, the battery cell connection unit 1100 includes a plurality of voltage measurement ports, in which the number of voltage measurement ports may correspond to the number of battery cells included in the battery module, and the voltage measurement unit 1200 may measure voltages of battery cells of the corresponding battery module through the voltage measurement ports, respectively. The measured voltage is measured based on a RAW type voltage signal for each of the battery cells, and the RAW type signal refers to an electrical signal which is not interfered with or distorted by external factors. In other words, the voltage measurement unit 1200 measures accurate voltage information on the battery cells and then transmits the voltage information to the MCU 1500, based on the RAW type voltage signals of the battery cells received through the voltage measurement ports, respectively. The MCU 1500 transmits the received voltage information to the master BMS 2000 in a wireless communication manner.

In addition, the voltage measurement unit 1200 may be connected to a high voltage alarm module (not shown) and a low voltage alarm module (not shown). When the voltage of at least one predetermined battery cell is higher or lower than a preset reference, the high voltage alarm module or the low voltage alarm module may immediately generate an alarm message and transmit the alarm message to the master BMS 2000 through the first wireless communication unit 1600.

The current measurement unit 1300 is configured to have a circuit form, and measures a current of a battery module connected to the corresponding direct BMS 1000 through a single current measurement port. More specifically, it may be preferable that the current measurement port may be positioned at an output terminal of a battery module or battery cell group connected to the direct BMS 1000, and the current measurement unit 1300 is provided to come into electrically and physically direct contact with the corresponding battery module.

The current measured through the current measurement port is measured based on a RAW type current signal for the corresponding battery module, and the RAW type signal refers to an electrical signal which is not interfered with or distorted by external factors as described above. In other words, the current measurement unit 1300 measures accurate current information on the battery module and then transmits the current information to the MCU 1500, based on the RAW type current signal for the battery module received through the current measurement port. The MCU 1500 transmits the received current information to the master BMS 2000 in a wireless communication manner.

In addition, the current measurement unit 1300 may be connected to an overcurrent alarm module (not shown). When the current of the corresponding battery module is higher than a preset reference, the overcurrent alarm module may immediately generate an alarm message and transmit the alarm message to the master BMS 2000 through the first wireless communication unit 1600.

In addition, according to another embodiment of the present invention, the battery cell connection unit 1100 includes a plurality of current measurement ports, and the current measurement ports, like the voltage measurement ports shown in FIG. 3, may be connected to the battery cells to measure currents of the battery cells, respectively. However, the present specification will be described based on the embodiment in which one direct BMS 1000 is provided with a single current measurement port.

The temperature measurement unit 1400 is provided inside the direct BMS 1000 together with the voltage measurement unit 1200 and the current measurement unit 1300, and includes a temperature sensor. The temperature measurement unit 1400 may measure a temperature of a substrate provided with the direct BMS 1000, through the temperature sensor. According to one embodiment of the present invention, the temperature measurement unit 1400 may be connected to an external temperature sensor, and the external temperature sensor may measure a temperature of the battery module or the like connected to the direct BMS 1000 and transmit a measured result to the temperature measurement unit 1400.

The temperature measurement unit 1400 transmits the measured result on the corresponding battery module to the MCU 1500, and the MCU 1500 transmits the result to the master BMS 2000 through the first wireless communication unit 1600. The temperature measurement unit 1400 may be connected to an overheating alarm module (not shown). When the temperature measured by the temperature measurement unit 1400 is higher than a preset reference, the overheating alarm module may immediately generate an alarm message to transmit the alarm message to the master BMS 2000 through the first wireless communication unit 1600. In addition, The temperature measurement unit 1400 may be connected to the voltage measurement unit 1200, so as to use a portion of power introduced into the voltage measurement unit 1200.

As described above, the MCU 1500 may receive the results measured by the voltage measurement unit 1200, the current measurement unit 1300, and the temperature measurement unit 1400 and then processes data and transmit the processed data to the first wireless communication unit 1600. In addition, the MCU 1500 controls each detailed configuration of the direct BMS 1000 including the voltage measurement unit 1200, the current measurement unit 1300, and the temperature measurement unit 1400.

The first wireless communication unit 1600 is connected to the MCU 1500 to perform wireless communication with the master BMS 2000. As shown in FIG. 3, the first wireless communication unit 1600 includes a modem unit 1610 and a transceiver unit 1620, and performs data transmission steps (S10 to S13) of modulating binarized data received from the MCU 1500 into a phase shift modulation signal and modulating the phase shift modulation signal into a differential phase shift modulation signal, thereby transmitting the modulated differential phase shift modulation signal to an outside, in order to transmit the data received from the MCU 1500 to the master BMS 2000 (see FIG. 7); and data reception steps (S20 to S25) of demodulating a differential phase shift modulation signal received by a first antenna unit 1700 into a phase shift modulation signal and demodulating a decoded phase shift modulation signal into binarized data, thereby transmitting the binarized data to the MCU 1500, in order to receive data from the master BMS 2000 (see FIG. 8). The first wireless communication unit 1600 will be described later in more detail in the description of FIGS. 5 to 8.

Figure 5:
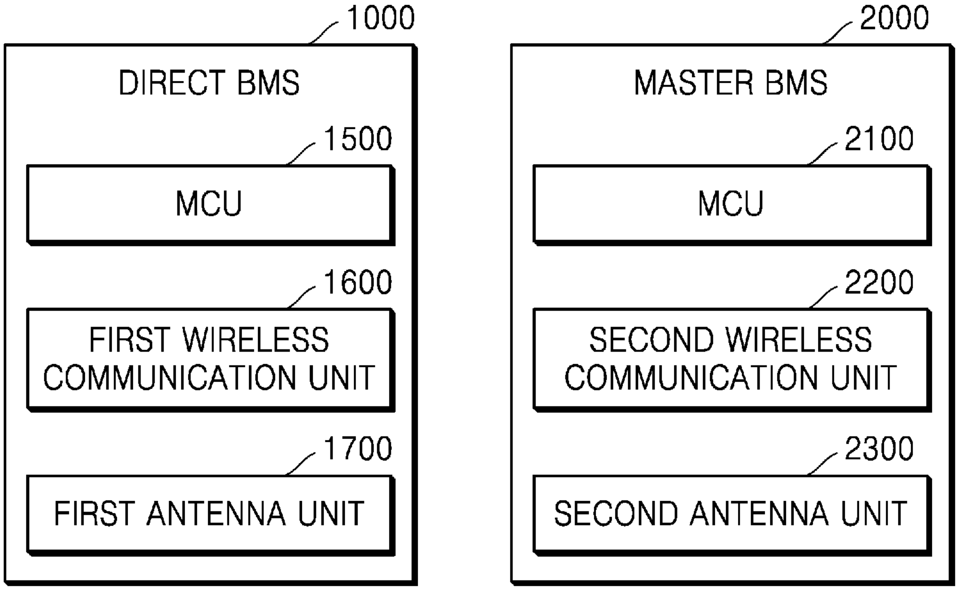
FIG. 5 schematically shows the internal configuration for performing asynchronous wireless communication in each of the direct BMS and the master BMS according to one embodiment of the present invention.

The first antenna unit 1700 connected to the first wireless communication unit 1600 is configured to have a circuit form. The first antenna unit 1700 forwards the modulation signal in the first wireless communication unit 1600 to broadcast to the outside, or receives the signal broadcasted by the master BMS 2000 to transmit the received signal to the first wireless communication unit 1600. Referring to FIG. 5, the signal broadcasted from the first antenna unit 1700 may be received in a second antenna unit 2300 of the master BMS 2000. As an exemplary embodiment, an antenna included in the first antenna unit 1700 may transmit and receive radio waves in a 900 MHz band.

Figure 4:
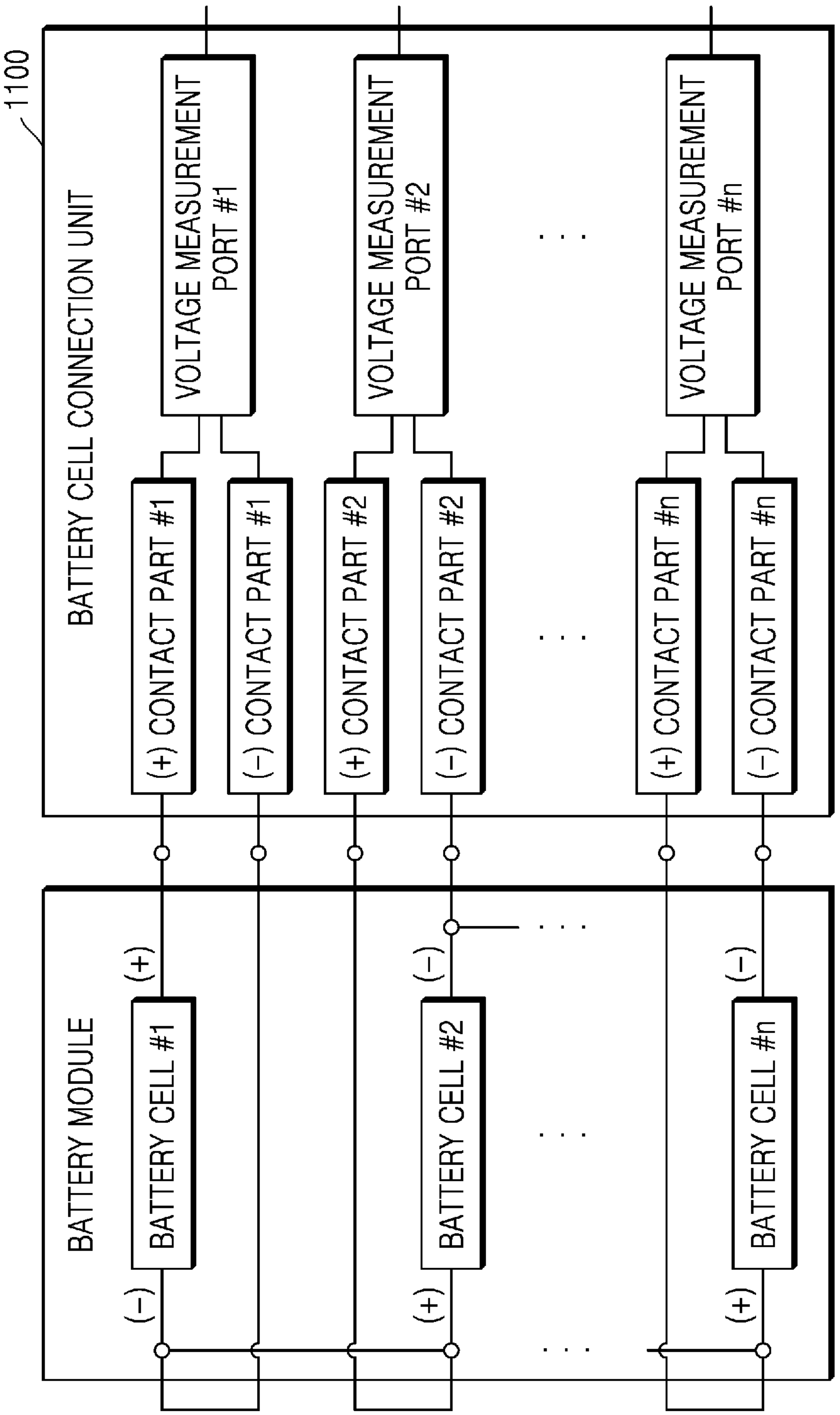
FIG. 4 schematically shows the configuration of a battery module and a battery cell connection unit according to one embodiment of the present invention.

FIG. 4 schematically shows the configuration of a battery module and a battery cell connection unit 1100 according to one embodiment of the present invention.

As shown in FIG. 4, both of a positive terminal and a negative terminal of the battery cell may come into direct contact with a port provided in the battery cell connection unit 1100, and the voltage measurement unit 1200 may be connected to each of the ports to measure a voltage of each battery cell.

Specifically, as described above, the voltage measurement unit 1200 of the direct BMS 1000 may measure the exact voltage of each battery cell by receiving a RAW type voltage signal for each of the battery cells included in the battery module connected to the direct BMS 1000, through a plurality of voltage measurement ports included in the battery cell connection unit 1100.

More specifically, the battery cells are connected in series with each other in the battery module. As an exemplary embodiment, the battery cells in the battery module may be disposed such that (+) electrodes and (−) electrodes are alternate to each other. The exposed (+) electrode and (−) electrode of each battery cell are configured to come into physically and electrically direct contact with the (+) contact part and (−) contact part of the battery cell connection unit 1100, respectively. In other words, the (+) electrode of the battery cell is actually one component directly connected to the (+) contact part positioned inside the battery cell connection unit 1100, and the (−) electrode of the battery cell is actually one component directly connected to the (−) contact part positioned inside the battery cell connection unit 1100.

In addition, referring to FIG. 3, each of the voltage measurement ports connected to the voltage measurement unit 1200 is configured to come into physically and electrically direct contact simultaneously with one (+) contact part and one (−) contact part. According to the above configuration, each of the voltage measurement ports may receive a RAW type voltage signal for each battery cell, and the voltage measurement unit 1200 may accurately measure the voltage of the corresponding battery cell based on the received RAW type voltage signal.

In other words, unlike the conventional battery management system technology, since data or signals have no interference or loss in the process of reaching the direct BMS starting from the battery cell, the RAW type voltage signal may be directly transferred to the direct BMS 1000, and the voltage measurement unit 1200 inside the direct BMS 1000 may measure the accurate voltage based on the RAW type voltage signal. Thus, according to the above configuration, the electromagnetic interference isolator (EMI Isolator) included in the conventional battery management system can be excluded.

In addition, as shown in FIG. 3, the current measurement port of the battery cell connection unit 1100 is also configured to come into physically and electrically direct contact with the battery module, so that a RAW type current signal may be directly transferred to the direct BMS 1000, the current measurement unit 1300 inside the direct BMS 1000 may measure the accurate current based on the RAW type current signal.

In addition, in one embodiment of the present invention, the voltage measurement unit 1200 and the current measurement unit 1300 may measure voltages and currents of the battery cell according to time, and transfer waveforms of the output voltage and waveforms of the output current of the battery cell according to time to the MCU 1500.

In addition, the direct BMS 1000 is configured to be directly connected to the battery module, so that an individual impedance of each of the battery cells may be derived. When each individual impedance is derived, an abnormal battery cell within the battery module may be individually detected. For example, the problems such as fire that may occur when the balance of a voltage or the like between the battery cells is not maintained can be prevented at an early stage, and this corresponds to an advanced effect compared to the related art of measuring an average voltage in the battery module.

FIG. 5 schematically shows the internal configuration for performing asynchronous wireless communication in each of the direct BMS 1000 and the master BMS 2000 according to one embodiment of the present invention.

As shown in FIG. 5, each of the direct BMSs 1000 includes a first wireless communication unit 1600 and a first antenna unit 1700 for performing wireless communication with the master BMS 2000, and the master BMS 2000 includes a second wireless communication unit 2200 and a second antenna unit 2300 for performing wireless communication with each of the direct BMSs 1000. The first wireless communication unit 1600 is connected to the MCU 1500 to receive information received from the voltage measurement unit 1200, the current measurement unit 1300, and the temperature measurement unit 1400, and the second wireless communication unit 2200 is connected to a control unit 2100 to transfer the data received from the direct BMSs 1000 to the control unit 2100.

The control unit 2100 may include at least one memory and at least one processor, and diagnose a state of the entire battery module or each of the battery cells connected to the direct BMSs 1000, based on the data received through the second wireless communication unit 2200. In one embodiment of the present invention, the control unit 2100 may determine a state of the entire batteries provided in the vehicle, based on the diagnosis result on the state of the battery module or battery cell. For example, the control unit 2100 may derive the possibility of fire occurring during charging, or derive a remaining driving distance in real time by considering a current driving state and a battery state during driving.

In addition, the control unit 2100 may broadcast control information on each of the direct BMSs 1000 through the second wireless communication unit 2200 and the second antenna unit 2300. The wireless communication between the master BMS 2000 and the direct BMS 1000 will be described later in more detail in the description of FIGS. 9 and 10.

Figure 6:
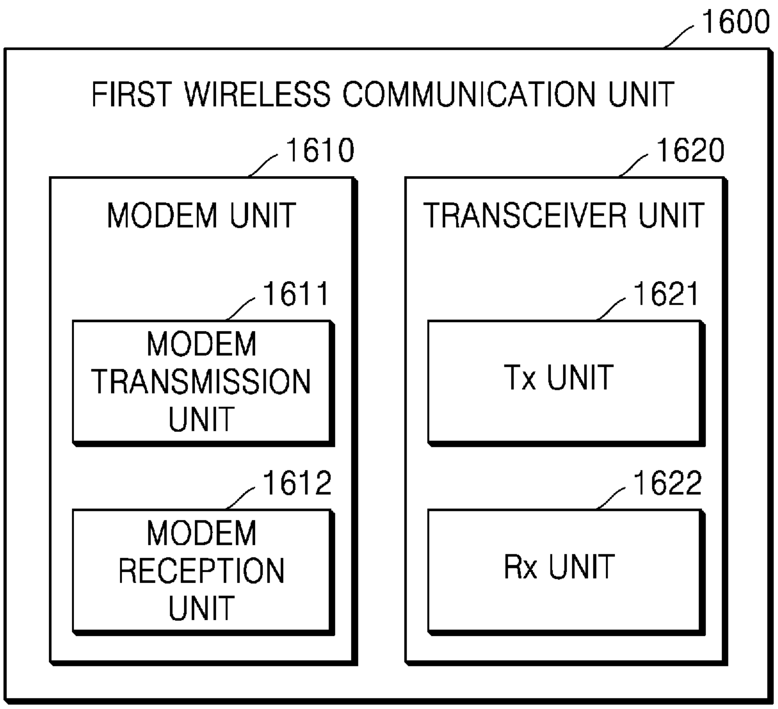
FIG. 6 schematically shows the internal configuration of a first wireless communication unit according to one embodiment of the present invention.

FIG. 6 schematically shows the internal configuration of the first wireless communication unit 1600 according to one embodiment of the present invention.

As shown in FIG. 6, the first wireless communication unit 1600 includes a modem unit 1610 and a transceiver unit 1620, and the modem unit 1610 includes: a modem transmission unit 1611 for performing modulation to transmit information received from the MCU 1500 to the master BMS 2000; and a modem reception unit 1612 for performing demodulation to transfer a signal received from the master BMS 2000 to the MCU 1500. In addition, the transceiver unit 1620 includes: a Tx unit 1621 including a component for broadcasting the signal modulated by the modem transmission unit 1611 through the first antenna unit 1700; and an Rx unit 1622 including a component for processing a signal received through the first antenna unit 1700.

More specifically, the modem transmission unit 1611 includes a hardware and/or software component for modulating digital data received from the MCU 1500 into a phase shift modulation signal (PSMS) and modulating a phase shift modulation signal (PSMS) into a differential phase shift modulation signal (DPSMS), and the modem reception unit 1612 includes a hardware and/or software component for demodulating a received differential phase shift modulation signal (DPSMS) into a phase shift modulation signal (PSMS) and demodulating a demodulated phase shift modulation signal (PSMS) into a digital signal. The data transmission steps (S10 to S13) and the data reception steps (S20 to S25) performed by the modem unit 1610 will be described later in more detail in the description of FIGS. 7 and 8.

In addition, the Tx unit 1621 includes: a filter configured as hardware and/or software for processing the signal modulated by the modem transmission unit 1611; a digital-to-analogue converter (DAC); and the like, and the Rx unit 1622 includes: a filter configured as hardware and/or software for processing the signal received by the first antenna unit 1700; an analogue-to-digital converter (ADC); and the like.

In other words, information received from the MCU 1500 of the direct BMS 1000 may be transferred to the first antenna unit 1700 via the modem transmission unit 1611 and the Tx unit 1621 and transmitted to the master BMS 2000, and information transmitted from the control unit 2100 of the master BMS 2000 may be received through the first antenna unit 1700 and transferred to the MCU 1500 via the Rx unit 1622 and the modem reception unit 1612.

Thus, according to the present invention, the master BMS and the direct BMSs are configured to perform asynchronous wireless communication, so that more stable wireless communication can be implemented in an environment in which line of sight (LOS) is not ensured due to aluminum shielding inside the battery pack of the vehicle.

In addition, the above configuration is adopted and the configuration, which is related to a communication station passed through in the middle and adopted in the conventional battery management system including a slave BMS or a module BMS, is excluded, so that the wireless communication system can have a more simplified configuration.

Figure 7:
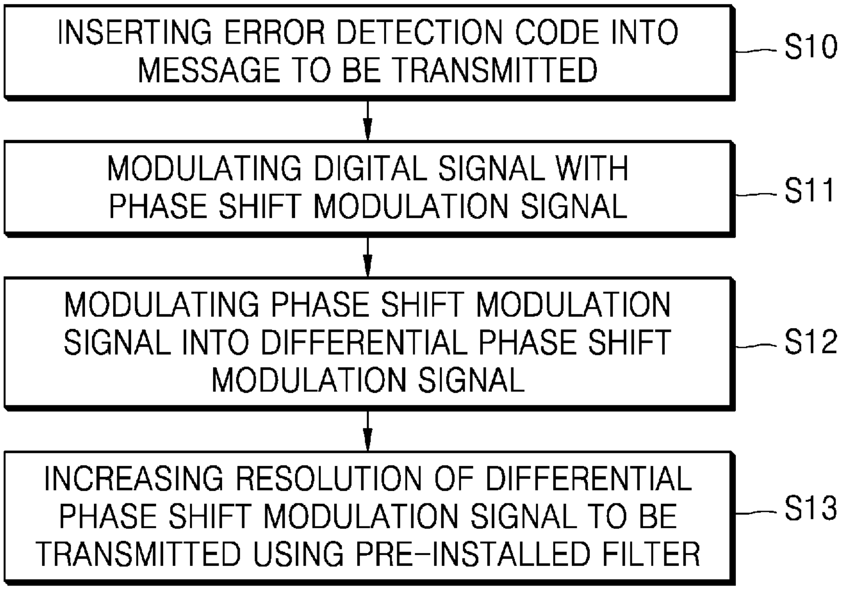
FIG. 7 schematically shows performing steps of a data transmission step performed by a modem transmission unit and a Tx unit according to one embodiment of the present invention.

FIG. 7 schematically shows performing steps of the data transmission step (S10 to S13) performed by the modem transmission unit 1611 and the Tx unit 1621 according to one embodiment of the present invention.

As a whole, as described above, the information received from the MCU 1500 of the direct BMS 1000 may be transferred to the first antenna unit via the modem transmission unit 1611 and the Tx unit 1621 and transmitted to the master BMS 2000. Hereinafter, the data transmission step (S10 to S13) of transmitting the data processed by the MCU 1500 to the master BMS 2000 will be described.

Specifically, as shown in FIG. 7, when the modem transmission unit 1611 receives the binarized digital signal from the MCU 1500, the modem transmission unit 1611 inserts an error detection code into a message composed of the received digital signal (S10). The error detection code refers to a code used in the process of receiving from the master BMS 2000, and may preferably have a size of 16 bits.

Thereafter, the modem transmission unit 1611 performs a step (S11) of modulating the message into which the error detection code is inserted into a phase shift modulation signal (PSMS). The phase shift modulation signal (PSMS) refers to a signal modulated in a manner that a phase of a carrier wave is changed according to an information value of a digital message. Thereafter, the modem transmission unit 1611 performs a step (S12) of modulating the phase shift modulation signal (PSMS) into a differential phase shift modulation signal (DPSMS). Step S12 corresponds to a configuration for solving the problem of the phase shift modulation signal (PSMS) that is capable of only the synchronous detection. The differential phase shift modulation signal (DPSMS) refers to a signal differentially encoded such that a phase difference between front and back signal sections corresponds to information to be modulated in which detection is conducted using a phase shift modulation signal (PSMS) prior to a predetermined section as a reference wave.

In other words, the differential phase shift modulation signal (DPSMS) refers to a signal in which information is not contained in an absolute phase of the carrier wave, but in a relative phase difference in adjacent bit sections. Information may be determined by discriminating whether the signal phase in the current bit section is the same as or different from the phase in the previous bit section.

For example, modulation may be performed by maintaining an output logic value the same as a previous output logic value when information bit "1" is transmitted, and modulation may be performed by changing the output logic value differently from the previous output logic value when information bit "0" is transmitted. In order to perform step S11 and step S12, the modem transmission unit 1611 may include components implemented as hardware or software, such as a delay circuit, an amplitude level shifter, and a multiplier modulator.

As above, when wireless communication is performed through the differential phase shift modulation signal (DPSMS), synchronization is unnecessary, and accordingly, no separate configuration or program for synchronization is required. Thereafter, the Tx unit 1621 may perform a step (S13) of increasing a resolution of the differential phase shift modulation signal (DPSMS) received from the modem transmission unit 1611 by using a pre-installed filter, and convert the signal passing through the filter into an analog signal through a separate component (for example, ADC) and propagate the converted signal through the first antenna unit 1700.

In addition, since the master BMS and direct BMS transmit and receive data frequently but the size of the data is not large, a bulky or power-consuming communication system is unnecessary. Since a simple and stable communication system is suitable based on a lifespan of the vehicle, the above-described wireless communication system used in the present invention satisfies all of the above conditions.

In addition, referring to FIG. 5, the second wireless communication unit 2200 of the master BMS 2000 includes a configuration similar to that of the first wireless communication unit 1600 for performing the aforementioned data transmission steps (S10 to S13). Thus, the differential phase shift modulation signal (DPSMS) is transmitted to the direct BMSs 1000 through the configuration of the second wireless communication unit 2200.

Figure 8:
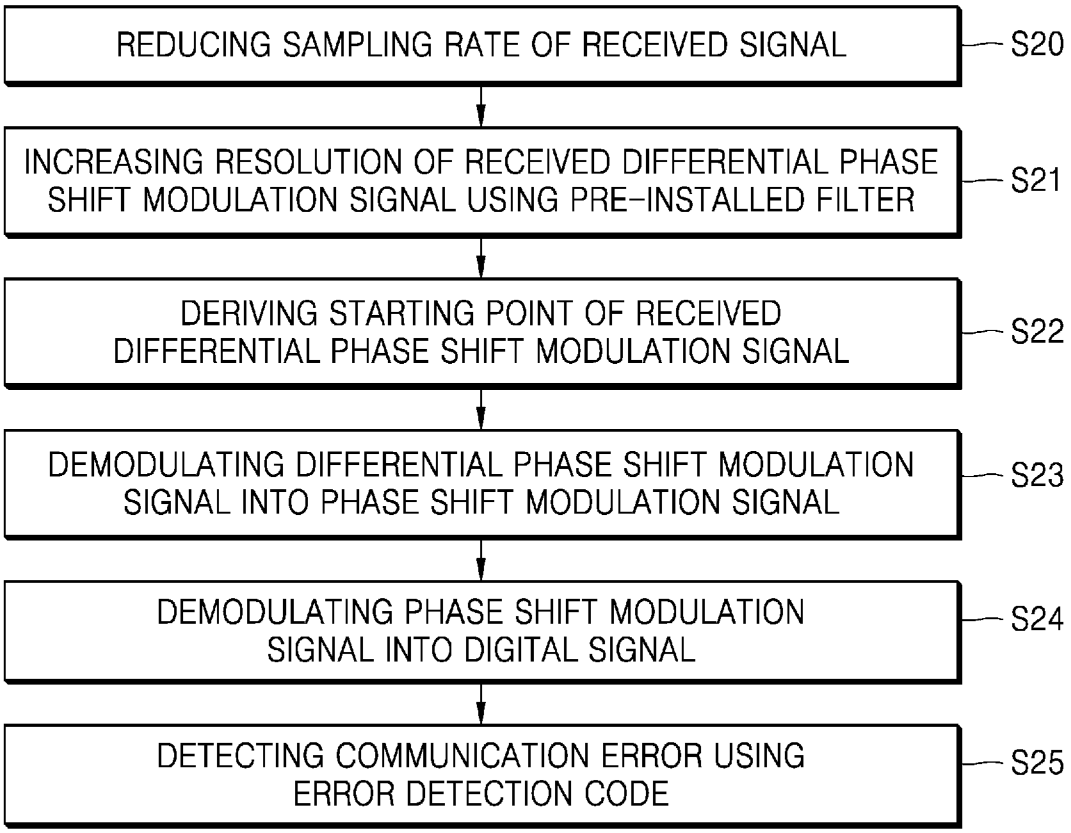
FIG. 8 schematically shows performing steps of data reception step performed by a modem reception unit and an Rx unit according to one embodiment of the present invention.

FIG. 8 schematically shows performing steps of data reception step (S20 to S25) performed by the modem reception unit 1612 and an Rx unit 1622 according to one embodiment of the present invention.

As a whole, as described above, the signal broadcasted by the master BMS 2000 may be received by the first antenna unit 1700 and transferred to the Rx unit 1622 and the modem receiver (1612), and then transferred to the MCU 1500 of the direct BMS 1000. Hereinafter, the data reception steps (S20 to S25) of transferring the data received from the first antenna unit 1700 to the MCU 1500 will be described.

Specifically, as shown in FIG. 8, the Rx unit 1622 performs a step (S20) of converting the signal received through the first antenna unit 1700 into a digital signal through a separate component (for example, DAC) and then reducing the sampling rate. More specifically, in step S20, a sampling rate is lowered by averaging the sampled signal for each predetermined section, thereby improving the resolution of the received signal. The signal received by the first antenna unit 1700 also corresponds to a differential phase shift modulation signal (DPSMS), and the differential phase shift modulation signal (DPSMS) received by the first antenna unit 1700 corresponds to a signal modulated by the second wireless communication unit 2200 of the master BMS 2000 in a manner similar to the data transmission steps S10 to S13 described above in the description of FIG. 7.

Thereafter, the Rx unit 1622 performs a step (S21) of increasing the resolution of the differential phase shift modulation signal (DPSMS) having the sampling rate reduced by using a pre-installed filter, and the modem reception unit 1612 performs a step (S22) of deriving a starting point of a signal at which step S21 is performed. When the starting point of the differential phase shift modulation signal (DPSMS) is derived through step S22, the modem reception unit 1612 performs a step (S23) of demodulating the corresponding signal into a phase shift modulation signal (PSMS) by differential decoding, and performs a step (S24) of demodulating the demodulated phase shift modulation signal (PSMS) into a digital signal composed of 0 or 1.

After the signal received through the first antenna unit 1700 is demodulated into the digital signal, the modem reception unit 1612 performs a step (S25) of detecting a communication error for the corresponding signal by using the error detection code. The error detection code corresponds to a code shared by the master BMS 2000 and the corresponding direct BMS 1000. When determining that the received signal has an error, the direct BMS 1000 may wait for receiving a message again, or transmit a request to the master BMS 2000 to re-transmit the corresponding message. When determining that the received signal has no error, the modem reception unit 1612 transfers the corresponding signal to the MCU 1500.

As described above in the description of FIG. 7, according to the present invention, the wireless communication is performed between the master BMS 2000 and the direct BMS 1000 through the differential phase shift modulation signal (DPSMS), so that a separate configuration or program for detecting synchronization during performing the steps S20 to S25 is not required.

In addition, when the wireless communication is performed using the modulation/demodulation scheme of the present invention, the structure is simple and a narrow bandwidth is used compared to wireless communication systems using other modulation/demodulation schemes, so that optimized wireless communication can be performed in a harsh environment, such as vehicle batteries, with a limited space and a restricted weight. In one embodiment of the present invention, the wireless communication system of the present invention has good frequency efficiency, so that dozens of 200 kHz narrowband channels may be used. Thus, one-to-many communication, such as the master BMS (2000) to the direct BMSs 1000, can be implemented even in a small bandwidth.

In addition, referring to FIG. 5, the second wireless communication unit 2200 of the master BMS 2000 includes a configuration similar to that of the first wireless communication unit 1600 for performing the aforementioned data reception steps (S20 to S25). Through the configuration of the second wireless communication unit 2200, the master BMS 2000 may receive the differential phase shift modulation signal (DPSMS) transmitted from the direct BMS 1000, so that a state of the battery module or the battery cells connected to the direct BMS 1000 may be determined.

Figure 9:
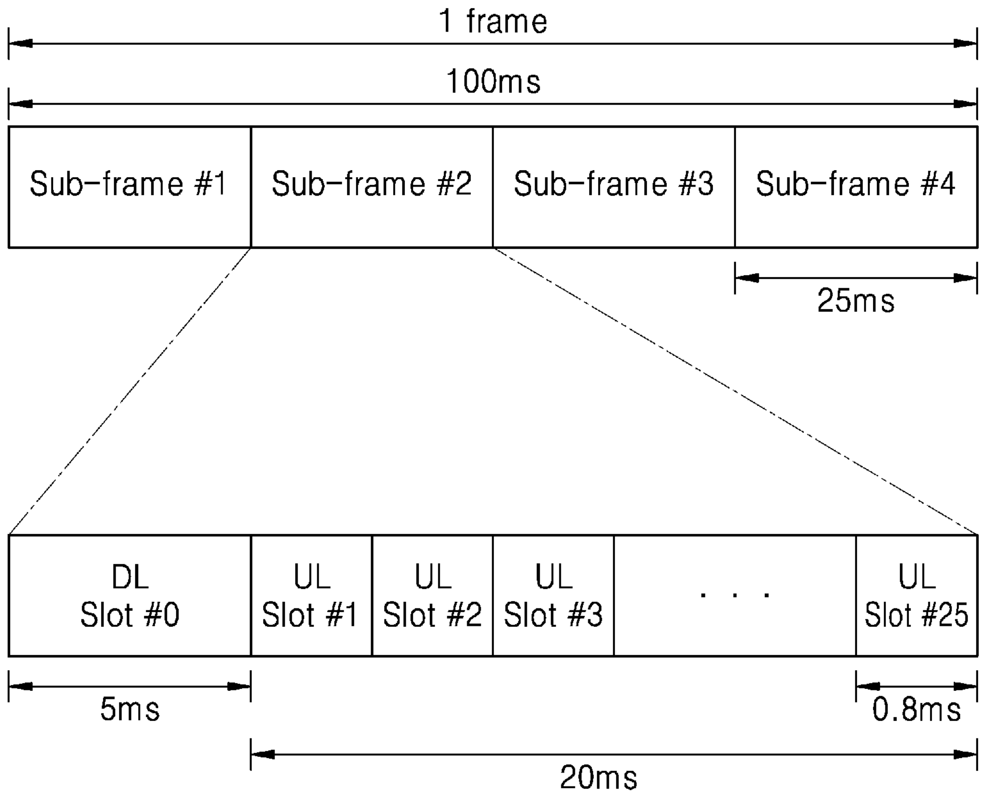
FIG. 9 schematically shows the structure of a communication frame in asynchronous wireless communication performed between a master BMS and a plurality of direct BMSs according to one embodiment of the present invention.
Figure 10:
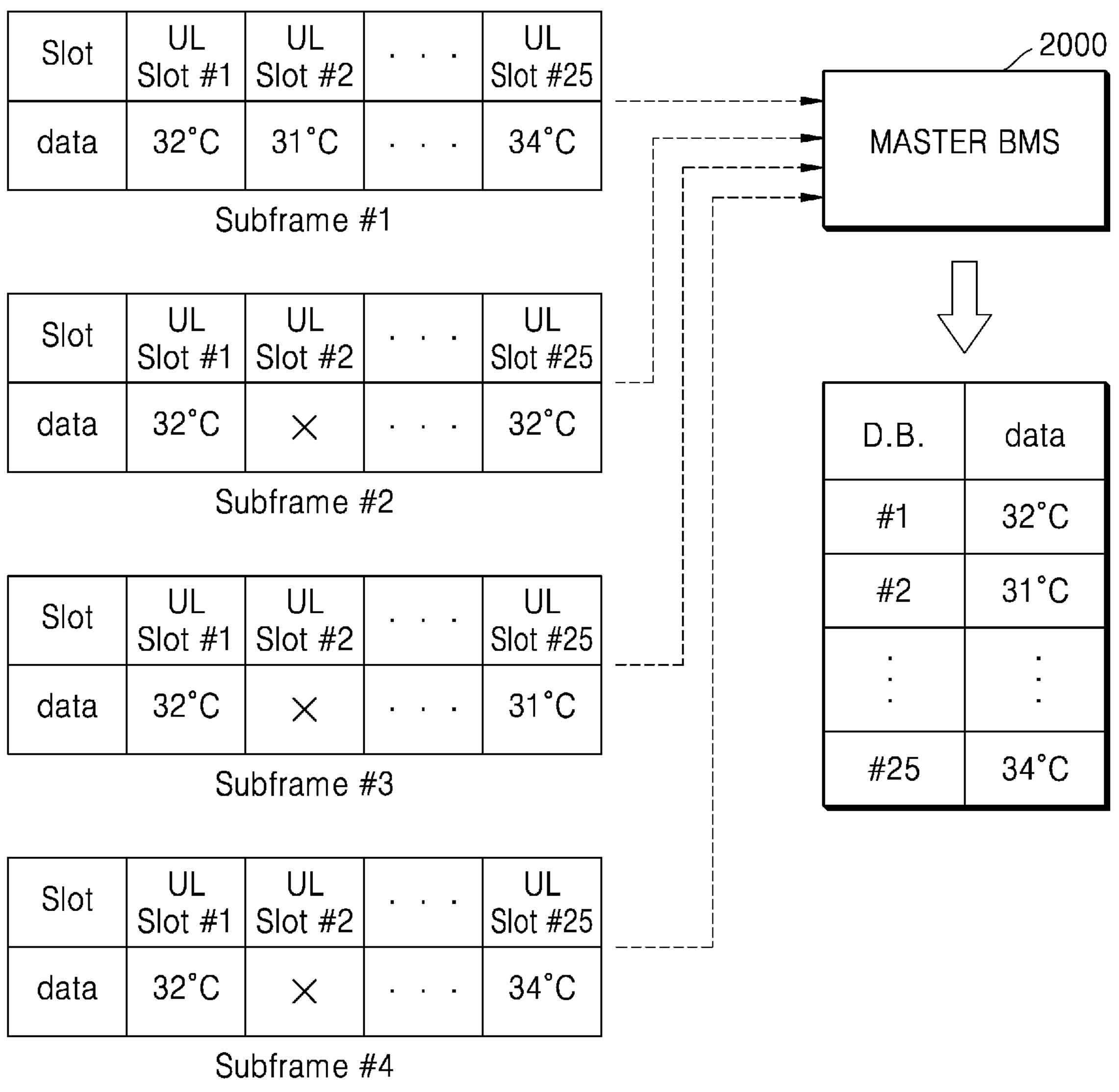
FIG. 10 schematically shows a process of processing information received by a master BMS from a plurality of direct BMSs according to one embodiment of the present invention.

FIG. 9 schematically shows the structure of a communication frame in asynchronous wireless communication performed between the master BMS 2000 and the direct BMSs 1000 according to one embodiment of the present invention. FIG. 10 schematically shows a process of processing information received by the master BMS 2000 from the direct BMSs 1000 according to one embodiment of the present invention.

As shown in FIGS. 9 and 10, the communication frame of a wireless communication channel through which the direct BMSs 1000 transmit and receive data with the master BMS 2000 via the first wireless communication unit 1600 includes a sub-frame including: a downlink frame broadcasted by the master BMS 2000 to the direct BMSs 1000; and a plurality of uplink frames transmitted by each of the direct BMSs 1000 to the master BMS 2000, in which the downlink frame and each of the uplink frames in the sub-frame may be divided temporally.

In addition, the data received by the direct BMSs 1000 through the downlink frame includes: identifier information of each direct BMS 1000; and time division information of an uplink frame related to the direct BMS 1000 having the corresponding identifier information, in which each direct BMS 1000 may transmit data to the master BMS 2000 through the uplink frame assigned to the direct BMS 1000, based on the time division information of the uplink frame included in the data received by the downlink frame.

In addition, the wireless communication channel is temporally configured to have a plurality of uplink frames subject to preset rules after the downlink frame, and data broadcasted in the downlink frame includes request information about a target to be transmitted from each direct BMS 1000, in which each direct BMS 1000 may generate response information according to the request information included in the data broadcasted in the downlink frame, so that data including the response information may be transmitted to the master BMS 2000 according to time division information of its own uplink frame.

In addition, the communication frame of the wireless communication channel may include a plurality of identical sub-frames, and the master BMS 2000 may finally determine received data, based on a plurality of received identical uplink frames.

Specifically, in one embodiment of the present invention, a communication frame (=1 frame) corresponding to a wireless communication cycle between the direct BMS 1000 and the master BMS 2000 may be set to a length of 100 ms. In a normal vehicle, since the transmission/reception cycle of data corresponds to 100 ms and the response time of several sensor nodes connected to the direct BMS 1000 has a cycle of 100 ms, it may be most preferable to set a length of the communication frame as 100 ms, and accordingly, the state of each of the battery cells may be most quickly determined.

In addition, as shown in FIG. 9, repeated communication may be performed 4 times during one communication frame, so that response to communication errors and stability of communication can be increased. The cycle of the repeated communication is defined as a sub-frame. The sub-frame includes a downlink frame assigned for communication (downlink communication) from the master BMS 2000 to the direct BMS 1000, and an uplink frame assigned for communication (uplink communication) from the direct BMS 1000 to the master BMS 2000.

The downlink frame refers to the time assigned for allowing the master BMS 2000 to broadcast to the direct BMSs 1000 as a target, in which the direct BMSs 1000 prepare for the data reception steps (S20 to S25) during the corresponding time. A signal broadcasted by the master BMS 2000 in the downlink frame includes identifier information of each of the direct BMSs 1000, and time division information of an uplink frame related to the direct BMS 1000 having the corresponding identifier information.

For example, the data broadcasted by the master BMS 2000 in the downlink frame includes information including, for example, identifier information of direct BMS #1 1000.1 and a first time according to the identifier information of direct BMS #1 1000.1; and identifier information of direct BMS #2 1000.2 and a second time according to the identifier information of direct BMS #2 1000.2. Direct BMS #1 1000.1 receiving the data broadcasted by the master BMS 2000 performs the data transmission steps (S10 to S13) according to the first time, and direct BMS #2 1000.2 performs the data transmission steps (S10 to S13) according to the second time.

In addition, the data broadcasted by the master BMS 2000 may further include identifier information of each direct BMS 1000, and request information, command information or control information or the like according to the identifier information, and the direct BMS 1000 receiving the information may generate response information corresponding to the received request information, command information, or control information and transmit the generated response information to the master BMS 2000.

In addition, the number of sub-frames included in one communication frame shown in FIG. 9, the cycle of sub-frames, the cycle of uplink frames, the cycle of downlink frames, and the like correspond to one embodiment of the present invention, and may be modified at any time according to the intention of the designer.

In one embodiment of the present invention, when 25 direct BMSs 1000 are provided as shown in FIG. 9, one sub-frame includes one downlink frame and 25 uplink frames. At this point, the uplink frames may be preferably assigned one by one to the direct BMSs 1000, respectively, and assigned to different time zones. In other words, time division information is defined as information on time zone to which each of a plurality of uplink frames is assigned.

In addition, when repeated communication is performed by a total of 4 times for one communication frame, the one communication frame (=100 ms) includes 4 sub-frames (=25 ms*4=100 ms), and the one sub-frame (=25 ms) includes one downlink frame (=5 ms) and a total of 25 uplink frames (=0.8 ms*25=20 ms).

To summarize this, the wireless communication system adopted in the present invention corresponds to a system in which the master BMS 2000 simultaneously transmits a message to the direct BMSs 1000 and then each of the direct BMSs 1000 receiving the corresponding message transmits data to the master BMS 2000 according to the uplink frame assigned to the direct BMS 1000. Since the wireless communication systems used in the conventional battery diagnosis technology have many uplink communication, the communication frame is configured to focus on the uplink frame. However, the present invention adopts the structure in which the downlink frame is placed at the beginning of the communication frame, so that reliability of data transmission and reception can be ensured in the early stage, and communication bandwidth can be utilized more efficiently.

In addition, the wireless communication system adopted in the present invention, is configured as a system optimized for the size of data and the number of nodes required when battery information is transmitted and received in real time in a vehicle using battery power as motive power, so that information about the vehicle's battery can be quickly and accurately provided to the user even when the vehicle is stopped, charging, or driving.

FIG. 10 shows one embodiment in which the master BMS 2000 determines the state of the battery modules based on information received for one cycle (=100 ms), and shows temperature information only among the information requested by the master BMS 2000 to each direct BMS 1000, for convenience of description.

As shown in FIGS. 9 and 10, the master BMS 2000 may transmit 4 messages to a plurality of direct BMSs 1000 through downlink frames included in each of sub-frames #1 to #4 during one cycle, in which the 4 messages may be the same message. The 25 direct BMSs 1000 receiving the message transmitted by the master BMS 2000 transmit information about batteries connected to the direct BMSs to uplink frames assigned to the direct BMSs, respectively, based on identifier information and time division information included in the message.

Like direct BMS #1 1000.1 assigned to Slot #1, when the master BMS 2000 receives all the same information from uplink frames Slot #1 in sub-frames #1 to #4, the master BMS 2000 determines a temperature of battery module #1 connected to direct BMS #1 1000.1 as 32° C.

In addition, like direct BMS #2 1000.2 assigned to Slot #2, when the master BMS 2000 normally receives data from uplink frame Slot #2 in sub-frame #1, but fails to normally receive from uplink frames Slot #2 in sub-frames #2 to #4, the master BMS 2000 may determine a temperature of direct BMS #2 1000.2 as 31° C. based on the information received from uplink frame Slot #1 in sub-frame #1.

According to one embodiment of the present invention, like Direct BMS #2 1000.2, when data communication errors occur more than a preset number of times, the master BMS 2000 may take actions such as instructing direct BMS #2 1000.2 to change a slot of the uplink frame or change a frequency channel.

In addition, like direct BMS #25 1000.25 assigned to Slot #25, when different information is received from uplink frames Slot #25 in sub-frames #1 to #4, the master BMS 2000 may determine information of the battery module based on information received from uplink frame Slot #25 in sub-frame #4 corresponding to the information received last among the 4 pieces of information as one embodiment of the present invention, may determine information of the battery module based on the most common information among the total of 4 pieces of information received in sub-frames #1 to #4 as another embodiment of the present invention, and may determine information of the battery module based on the average value of the total of 4 pieces of information received in sub-frames #1 to #4 as still another embodiment of the present invention. In addition, the present invention is not limited to the various embodiments described above, a person skilled in the art may modify and apply the design through known techniques.

Figure 11:
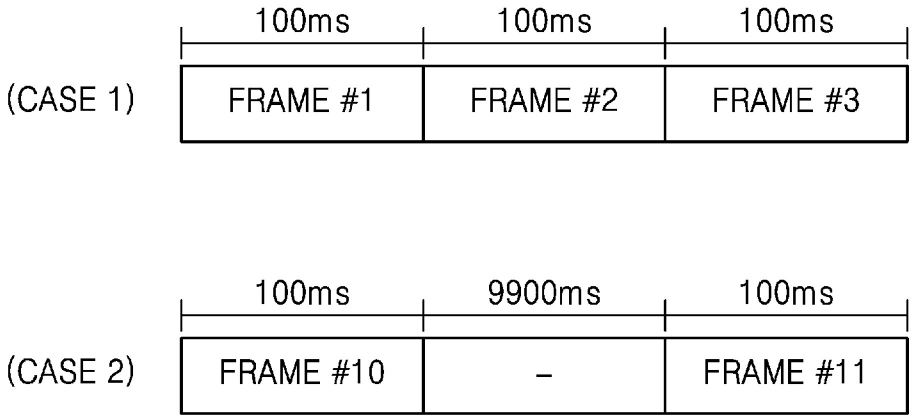
FIG. 11 schematically shows a communication cycle that varies according to a driving condition of a vehicle equipped with a battery according to one embodiment of the present invention.

FIG. 11 schematically shows a communication cycle that varies according to a driving condition of a vehicle equipped with a battery according to one embodiment of the present invention.

As shown in FIG. 11, the cycle of the communication frame of the wireless communication channel between the direct BMS 1000 and the master BMS 2000 or a time interval between successive communication frames, may vary according to a driving condition of the vehicle in which the battery module is installed.

Specifically, the present invention relates to a diagnostic system for a battery mounted in a vehicle, so that the communication cycle between the master BMS 2000 and the direct BMS 1000 can be varied according to a driving condition of the vehicle.

More specifically, Case 1 of FIG. 11 shows the cycle of the communication frame in a driving state. Since it is necessary to check the battery status in real time while driving, additional time interval is not added between successive communication frames, so that the master BMS 2000 and the direct BMS 1000 can continuously perform wireless communication.

In addition, Case 2 shows the cycle of the communication frame in a parking state. Since it is unnecessary to check the battery status in real time while parking, a separate time interval may be added between consecutive communication frames as shown in FIG. 11, so that power consumption can be minimized.

In addition, in the case of charging, which is different from Case 1 and Case 2, the cycle of the communication frame may be set to another cycle not shown in FIG. 11. In one embodiment of the present invention, when the diagnosis system is updated/debugged such as over-the-air (OTA) updates, the communication frame may be configured only with the downlink frame without the uplink frame.

According to one embodiment of the present invention, the direct BMS is configured to physically and electrically come into direct contact with the battery cells, thereby measuring the voltage and the current for the battery cells, so that noise generated due to channel switching can be prevented in the related art in which the battery and the direct BMS are indirectly connected through a cable or the like, and accordingly, the reliability of data measured for the battery cells can be increased.

According to one embodiment of the present invention, the direct BMS is configured to physically and electrically come into direct contact with each of the battery cells, thereby measuring voltage information on each of the battery cells, so that the conventional problem that a predetermined number of battery cells among a plurality of battery cells have different voltages and generate noise that cannot be corrected can be solved, and accordingly, data having more reliability can be obtained.

According to one embodiment of the present invention, a master BMS and a plurality of direct BMSs connected to each of a plurality of battery modules perform asynchronous wireless communication, so that the problems caused by applying or installing an isolator to a plurality of positions to prevent electro-magnetic interference from being induced in the wired communication system of the related art, such as deterioration in space efficiency, increase in weight, and increase in cost, can be solved.

According to one embodiment of the present invention, a plurality of direct BMSs and a master BMS connected to each of a plurality of battery modules include a communication modem capable of modulating a digital signal into a differential phase shift modulation signal or demodulating a differential phase shift modulation signal into a digital signal so as to perform asynchronous wireless communication, so that the communication module for performing the asynchronous wireless communication can have a simple structure but have a good frequency efficiency, and stable wireless communication can be implemented even in the special environment of a vehicle.

According to one embodiment of the present invention, the battery module and the direct BMS are physically directly connected without a separate component such as a cable, so that durability against vibration can be improved compared to the conventional vehicle battery management systems, and accordingly, reliability of measured data can be increased even in the special measurement situations such as high-speed driving environments.

Although the above embodiments have been described with reference to the limited embodiments and drawings, however, it will be understood by those skilled in the art that various changes and modifications may be made from the above-mentioned description For example, even though the described descriptions may be performed in an order different from the described manner, and/or the described components such as system, structure, device, and circuit may be coupled or combined in a form different from the described manner, or replaced or substituted by other components or equivalents, appropriate results may be achieved.

Therefore, other implementations, other embodiments, and equivalents to the claims are also within the scope of the following claims.

What is claimed is:

1. A system of diagnosing multiple battery cells positioned inside a vehicle, the system comprising:

a plurality of direct Battery Management Systems (BMSs) each disposed inside the vehicle and electrically connected to a plurality of battery cells included in a battery module; and a master BMS disposed inside the vehicle to perform wireless communication with the direct BMSs, wherein each of the direct BMSs includes:

a battery cell connection unit having ports coming into physically and electrically direct contact with exposed electrodes of the plurality of battery cells, respectively;

a voltage measurement unit electrically connected to the battery cell connection unit and having a circuit form to measure a voltage of each of the plurality of battery cells;

a current measurement unit electrically connected to the battery cell connection unit and having a circuit form to measure a current of each of the plurality of battery cells or the battery module;

a Microcontroller Unit (MCU); and a first wireless communication unit connected to the MCU to perform wireless communication with the master BMS, wherein the first wireless communication unit, upon transmitting data, modulates binarized data received from the MCU into a phase shift modulation signal and modulates the phase shift modulation signal into a differential phase shift modulation signal, thereby transmitting the modulated differential phase shift modulation signal to an outside, and upon receiving data, demodulates a received differential phase shift modulation signal into a phase shift modulation signal and demodulates the demodulated phase shift modulation signal into binarized data, thereby transmitting the demodulated binarized data to the MCU.

2. The system of claim 1, wherein both of a positive terminal and a negative terminal of each of the plurality of battery cells come into direct contact with a port provided in the battery cell connection unit, and the voltage measurement unit is connected to each of the ports to measure a voltage of each of the plurality of battery cells.

3. The system of claim 1, wherein a communication frame of a wireless communication channel through which the direct BMSs transmit and receive data with the master BMS via the first wireless communication unit includes a sub-frame including:

a downlink frame broadcasted by the master BMS to the direct BMSs; and a plurality of uplink frames transmitted by each of the direct BMSs to the master BMS, wherein the downlink frame and each of the uplink frames in the sub-frame are divided temporally.

4. The system of claim 3, wherein data received by the direct BMSs through the downlink frame includes:

identifier information of each of the direct BMSs; and time division information of an uplink frame related to the direct BMS having the corresponding identifier information, wherein each of the direct BMSs transmits data to the master BMS through the uplink frame assigned to the direct BMS, based on the time division information of the uplink frame included in the data received through the downlink frame.

5. The system of claim 3, wherein the wireless communication channel is temporally configured to have a plurality of uplink frames subject to preset rules after the downlink frame is broadcasted, data broadcasted in the downlink frame includes request information about a target to be transmitted from each of the direct BMSs, and each of the direct BMSs generates response information according to the request information included in the data broadcasted in the downlink frame, so that data including the response information is transmitted to the master BMS according to time division information of the uplink frame.

6. The system of claim 5, wherein the communication frame of the wireless communication channel includes a plurality of identical sub-frames, and the master BMS finally determines received data, based on a plurality of received identical uplink frames.

7. The system of claim 3, wherein a cycle of the communication frame of the wireless communication channel between the direct BMSs and the master BMS or a time interval between successive communication frames varies according to a driving condition of the vehicle in which the battery module is installed.

8. A method of diagnosing multiple battery cells performed by a system of diagnosing the multiple battery cells positioned inside a vehicle, the system including:

a plurality of direct Battery Management Systems (BMSs) each disposed inside the vehicle and electrically connected to a plurality of battery cells included in a battery module; and a master BMS disposed inside the vehicle to perform wireless communication with the direct BMSs, the method comprising:

physically and electrically bringing a port included in a battery cell connection unit into direct contact with an exposed electrode of each of the plurality of battery cells, by the battery cell connection unit of each of the direct BMSs;

measuring a voltage of each of the plurality of battery cells, by a voltage measurement unit of each of the direct BMSs;

measuring a current of each of the plurality of battery cells or the battery module, by a current measurement unit of each of the direct BMSs; and performing wireless communication with the master BMS, by a first wireless communication unit of each of the direct BMSs, wherein the first wireless communication unit is connected to an Microcontroller Unit (MCU) of each of the direct BMSs, and the first wireless communication unit, upon transmitting data, modulates binarized data received from the MCU into a phase shift modulation signal and modulates the phase shift modulation signal into a differential phase shift modulation signal to transmit the modulated differential phase shift modulation signal to an outside, and upon receiving data, demodulates a received differential phase shift modulation signal into a phase shift modulation signal and demodulates the phase shift modulation signal into binarized data to transmit the demodulated binarized data to the MCU.

* * * * *